United States Patent
Moon et al.

(10) Patent No.: US 12,054,820 B2
(45) Date of Patent: Aug. 6, 2024

(54) DEPOSITION APPARATUS HAVING MASK ASSEMBLY AND METHOD OF REPAIRING THE MASK ASSEMBLY

(71) Applicant: Samsung Display Co., Ltd., Yongin-si (KR)

(72) Inventors: Minho Moon, Seongnam-si (KR); Youngmin Moon, Yongin-si (KR); Ji-Hee Son, Hwaseong-si (KR); Seungyong Song, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/731,799

(22) Filed: Apr. 28, 2022

(65) Prior Publication Data
US 2023/0009272 A1    Jan. 12, 2023

(30) Foreign Application Priority Data
Jul. 9, 2021   (KR) .......................... 10-2021-0090128

(51) Int. Cl.
*C23C 14/04*    (2006.01)
*B05C 21/00*    (2006.01)
*H10K 71/00*    (2023.01)
*H10K 71/16*    (2023.01)

(52) U.S. Cl.
CPC .......... *C23C 14/042* (2013.01); *B05C 21/005* (2013.01); *H10K 71/166* (2023.02)

(58) Field of Classification Search
USPC ........................................................ 118/504
See application file for complete search history.

(56) References Cited

U.S. PATENT DOCUMENTS

| | | | | |
|---|---|---|---|---|
| 6,080,513 | A * | 6/2000 | Brugger | G03F 9/00 430/323 |
| 8,151,729 | B2 * | 4/2012 | Ko | B23K 31/02 118/301 |
| 8,402,917 | B2 * | 3/2013 | Ko | B05C 11/00 228/180.1 |
| 8,701,592 | B2 * | 4/2014 | Ko | C23C 14/042 118/301 |
| 9,321,074 | B2 * | 4/2016 | Ko | C23C 14/042 |
| 9,328,407 | B2 * | 5/2016 | Lee | B05C 21/005 |
| 9,757,764 | B2 * | 9/2017 | Hong | C23C 14/042 |
| 9,932,662 | B2 * | 4/2018 | Lee | C23C 14/042 |
| 10,053,766 | B2 * | 8/2018 | Kim | C23C 14/042 |
| 10,627,714 | B2 * | 4/2020 | Ji | G03F 1/66 |
| 10,711,338 | B2 * | 7/2020 | Kawato | C23C 14/042 |
| 11,268,184 | B2 * | 3/2022 | Qi | C23C 14/042 |

(Continued)

*Primary Examiner* — Jethro M. Pence
(74) *Attorney, Agent, or Firm* — KILE PARK REED & HOUTTEMAN PLLC

(57) ABSTRACT

A deposition apparatus includes a chamber, a mask assembly disposed in the chamber and including an open sheet including a first area in which a first deposition hole is defined and a second area in which a second deposition hole spaced apart from the first deposition hole is defined, a first mask including multiple deposition openings that overlap the first area, and a second mask including multiple deposition openings that overlap the second area, a deposition substrate disposed on the mask assembly, and a deposition source spraying a deposition material to the mask assembly.

6 Claims, 16 Drawing Sheets

(56) References Cited

U.S. PATENT DOCUMENTS

| | | | |
|---|---|---|---|
| 11,616,198 B2* | 3/2023 | Kim | H10K 71/164 |
| | | | 118/504 |
| 2010/0267227 A1* | 10/2010 | Ko | C23C 14/042 |
| | | | 156/60 |
| 2012/0156812 A1* | 6/2012 | Ko | C23C 14/042 |
| | | | 29/446 |
| 2013/0137334 A1* | 5/2013 | Ishikawa | C23C 14/042 |
| | | | 118/504 |
| 2015/0246416 A1* | 9/2015 | Mizumura | B23K 26/402 |
| | | | 118/504 |
| 2016/0281208 A1* | 9/2016 | Zhang | C23C 14/042 |
| 2018/0023183 A1* | 1/2018 | Kang | C23C 14/042 |
| | | | 118/720 |
| 2020/0384497 A1 | 12/2020 | LV et al. | |
| 2022/0013396 A1* | 1/2022 | Mei | C23C 14/042 |
| 2022/0181595 A1* | 6/2022 | Kim | C23C 14/042 |
| 2023/0023458 A1* | 1/2023 | Wang | C23C 14/042 |
| 2023/0031990 A1* | 2/2023 | Liu | C23C 14/042 |

* cited by examiner

DEPOSITION APPARATUS HAVING MASK ASSEMBLY AND METHOD OF REPAIRING THE MASK ASSEMBLY

CROSS-REFERENCE TO RELATED APPLICATION(S)

This U.S. non-provisional patent application claims priority to and the benefit of Korean Patent Application No. 10-2021-0090128 under 35 U.S.C. § 119, filed on Jul. 9, 2021 in the Korean Intellectual Property Office (KIPO), the entire contents of which are incorporated herein by reference.

BACKGROUND

1. Field of Disclosure

The disclosure relates to a deposition apparatus having a mask assembly and a method of repairing the mask assembly. More particularly, the disclosure relates to a deposition apparatus having a mask assembly that may be easily repaired and a method of repairing the mask assembly.

2. Description of the Related Art

Generally, a light emitting display device includes pixels and light emitting elements respectively disposed in the pixels. Each light emitting element includes a light emitting layer disposed between electrodes spaced apart from each other. Light emitting layers included in pixels may be grouped in multiple groups.

A mask is used to deposit group of pixels on a substrate. Pixels are formed by depositing a deposition material on a substrate after placing the substrate on the mask. When there is a defect in a mask, a process of replacing the defective mask may be required.

SUMMARY

The disclosure provides a deposition apparatus including a mask assembly that may be easily repaired.

The disclosure provides a method of repairing a mask assembly.

Embodiments of the disclosure provide a deposition apparatus including a chamber, a mask assembly disposed in the chamber and including an open sheet including a first area in which a first deposition hole is defined and a second area in which a second deposition hole spaced apart from the first deposition hole is defined, a first mask including deposition openings that overlap the first area, and a second mask including deposition openings that overlap the second area, a deposition substrate disposed on the mask assembly, and a deposition source spraying a deposition material to the mask assembly. The open sheet may include a first protrusion group including at least one first alignment protrusion and a first fixing protrusion, which may be disposed in the first area adjacent to the first deposition hole, and a second protrusion group including second alignment protrusions and a second fixing protrusion, which may be disposed in the second area adjacent to the second deposition hole. The number of the second alignment protrusions may be greater than the number of the at least one first alignment protrusion, the first mask may include a first protrusion hole overlapping the at least one first alignment protrusion, and the second mask may include second protrusion holes overlapping the second alignment protrusions.

The first protrusion group may be provided in plural, the multiple first protrusion groups may surround the first deposition hole, the second protrusion group may be provided in plural, and the multiple second protrusion groups may surround the second deposition hole.

The number of the first protrusion groups may be equal to the number of the second protrusion groups.

A distance between a first fixing protrusion of a first-first protrusion group among the multiple first protrusion groups and a first alignment protrusion of a first-second protrusion group among the multiple first protrusion groups may be greater than a distance between a second fixing protrusion of a second-first protrusion group among the multiple second protrusion groups and a second alignment protrusion of a second-second protrusion group among the multiple second protrusion groups, wherein the second alignment protrusion may be nearest to the second fixing protrusion of the second-first protrusion group.

A distance between a first alignment protrusion of the first-first protrusion group among the multiple first protrusion groups and the first alignment protrusion of the first-second protrusion group among the multiple first protrusion groups may be equal to or greater than about 2 mm or equal to or smaller than about 5 mm.

A distance between the at least one first alignment protrusion and the first fixing protrusion of the first protrusion group may be equal to a distance between the second alignment protrusions of the second protrusion group.

The at least one first alignment protrusion and the second alignment protrusions may have a diameter equal to or greater than about 200 micrometers and equal to or smaller than about 500 micrometers.

A diameter of the first protrusion hole and the second protrusion holes may be greater than the diameter of the at least one first alignment protrusion and the second alignment protrusions by about 10 micrometers or more to about 50 micrometers or less.

A distance between the second alignment protrusions may be equal to a distance between first alignment protrusions.

The at least one first alignment protrusion, the second alignment protrusion, the first fixing protrusion, the second fixing protrusion, the first protrusion hole, and the second protrusion hole may have an oval shape.

The open sheet may have a thickness equal to or greater than about 50 micrometers and equal to or smaller than about 150 micrometers.

The at least one first alignment protrusion and the second alignment protrusions may have a thickness equal to or greater than a depth of the first protrusion hole and the second protrusion holes.

Embodiments of the disclosure provide a method of repairing a mask assembly. The method includes providing an open sheet including a deposition hole and a first protrusion adjacent to the deposition hole, providing a first mask including deposition openings overlapping the deposition hole and a first protrusion hole overlapping the first protrusion, aligning the deposition hole with the deposition openings by combining the first protrusion with the first protrusion hole, and welding a portion on the first mask to form a second protrusion, wherein the first portion may be spaced apart from the first protrusion.

The method may further include removing the first mask combined with the open sheet and disposing a second mask including deposition openings overlapping the deposition hole on the open sheet. The second protrusion may remain on the open sheet when the first mask is removed.

The second mask may include second protrusion holes that overlap the first protrusion and the second protrusion, and the disposing of the second mask on the open sheet includes aligning the second protrusion holes with the first protrusion and the second protrusion and welding a second portion on the second mask to form a third protrusion, wherein the second portion may be spaced apart from the first protrusion and the second protrusion.

A distance between the first protrusion and the second protrusion and a distance between the second protrusion and the third protrusion may be same.

Each of the first protrusion, the second protrusion, and the third protrusion may have a diameter equal to or greater than about 200 micrometers and equal to or smaller than about 500 micrometers.

A diameter of the first protrusion hole and second protrusion holes may be greater than the diameter of the first protrusion and the second protrusion by about 10 micrometers or more to about 50 micrometers or less.

The open sheet, the first mask, and the second mask may include Invar.

The method may further include removing a dummy portion of the first mask along a cutting line defined in the first mask after the forming of the second protrusion.

Embodiments of the disclosure provide a mask assembly including an open sheet including a deposition hole and an alignment protrusion adjacent to the deposition hole and a mask including deposition openings overlapping the deposition hole, and a protrusion hole overlapping the alignment protrusion.

The open sheet may further include a fixing protrusion spaced apart from the alignment protrusion, and the fixing protrusion which may be provided by welding the mask with the open sheet after the alignment protrusion is combined with the protrusion hole.

The alignment protrusion and the fixing protrusion may be defined as a protrusion group, the protrusion group may be provided in plural, the multiple protrusion groups may surround the deposition hole, and the protrusion hole is provided in plural, the multiple protrusion holes corresponding the alignment protrusions of the multiple protrusion groups.

A separation distance between the alignment protrusions included in adjacent ones of the multiple protrusion groups may be equal to or greater than about 2 mm and equal to or smaller than about 5 mm.

The alignment protrusion may have a diameter equal to or greater than about 200 micrometers and equal to or smaller than about 500 micrometers.

A diameter of the protrusion hole may be greater than the diameter of the alignment protrusion by about 10 micrometers or more to about 50 micrometers or less.

According to the above, when replacing a mask, the process of removing a fixing protrusion, which may be formed by a welding process, may be omitted, and the fixing protrusion may be used as an alignment protrusion by forming a hole through a newly place mask. Thus, the time and the cost consumed to remove the existing fixing protrusion may be reduced.

In addition, damages to an open sheet in the process of removing the fixing protrusion may be reduced. As the existing fixing protrusion is used as the alignment protrusion in the repairing process, the deposition performance of the mask assembly included in the deposition apparatus may be improved.

BRIEF DESCRIPTION OF THE DRAWINGS

The above and other advantages of the disclosure will become readily apparent by reference to the following detailed description when considered in conjunction with the accompanying drawings wherein.

DETAILED DESCRIPTION

Figure 1:
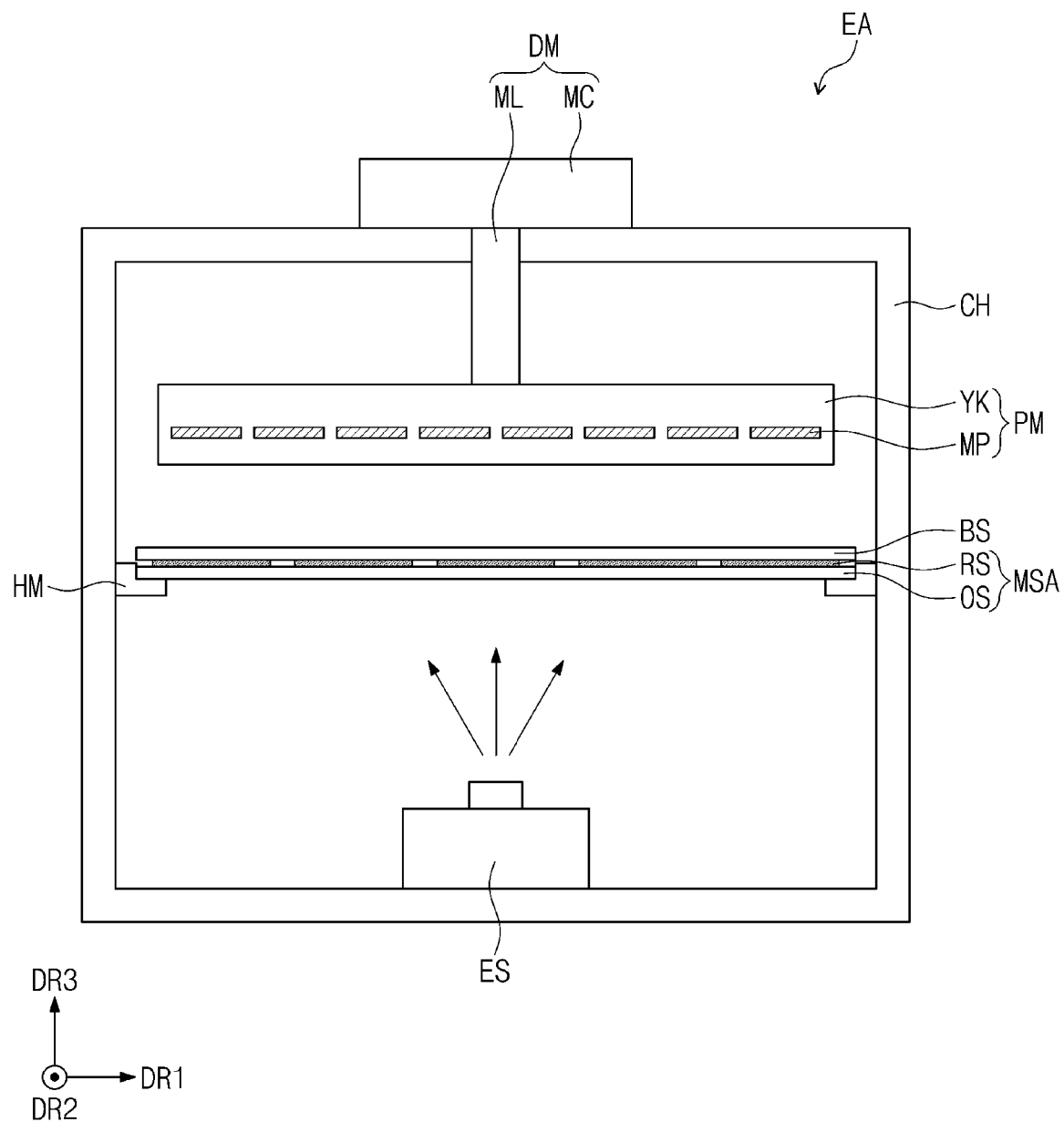
FIG. 1 is a plan view showing a deposition apparatus according to an embodiment of the disclosure.

In the disclosure, it will be understood that when an element or layer is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the disclosure will be explained in detail with reference to the accompanying drawings.

Figure 2:
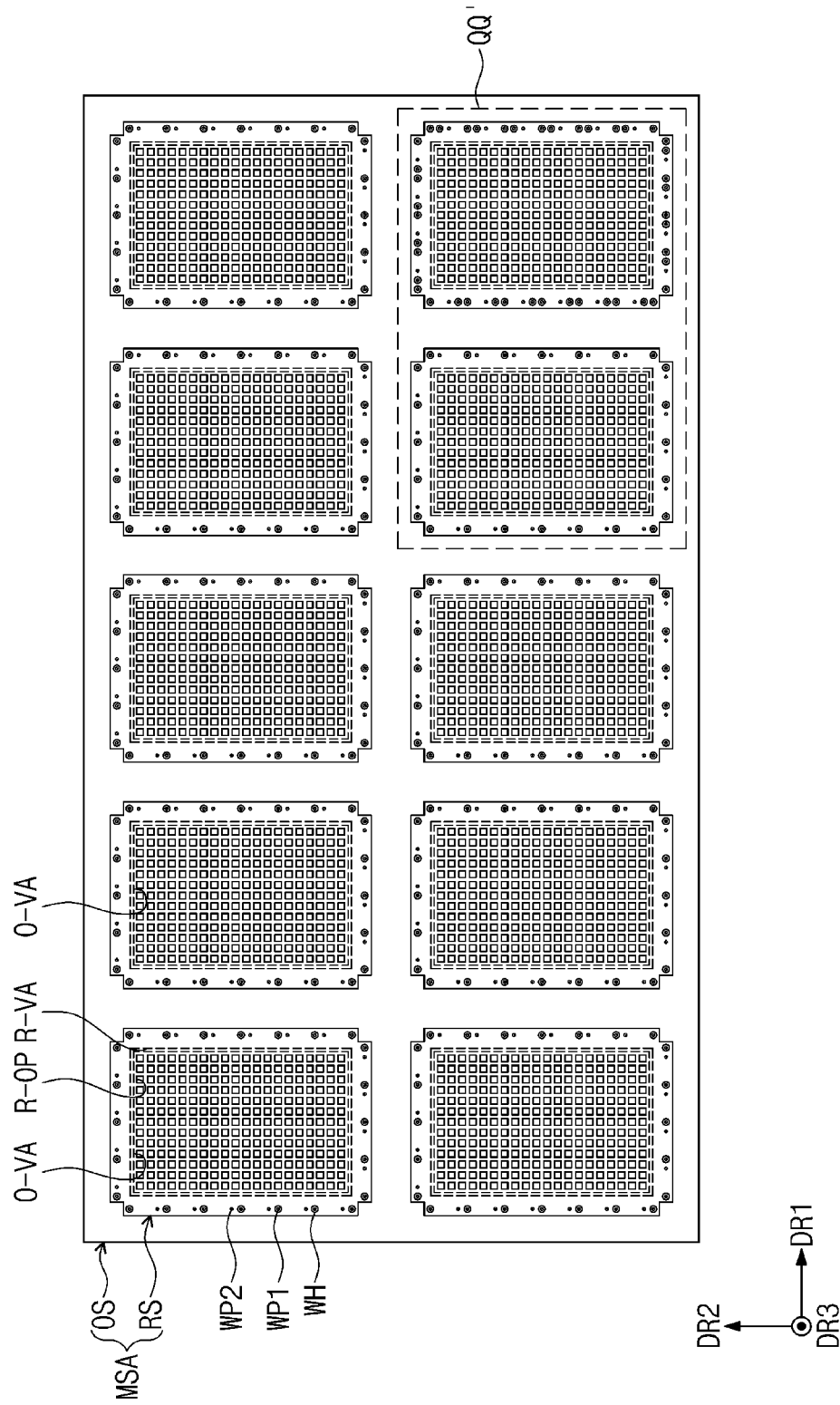
FIG. 2 is a plan view showing a mask assembly according to an embodiment of the disclosure.
Figure 3:
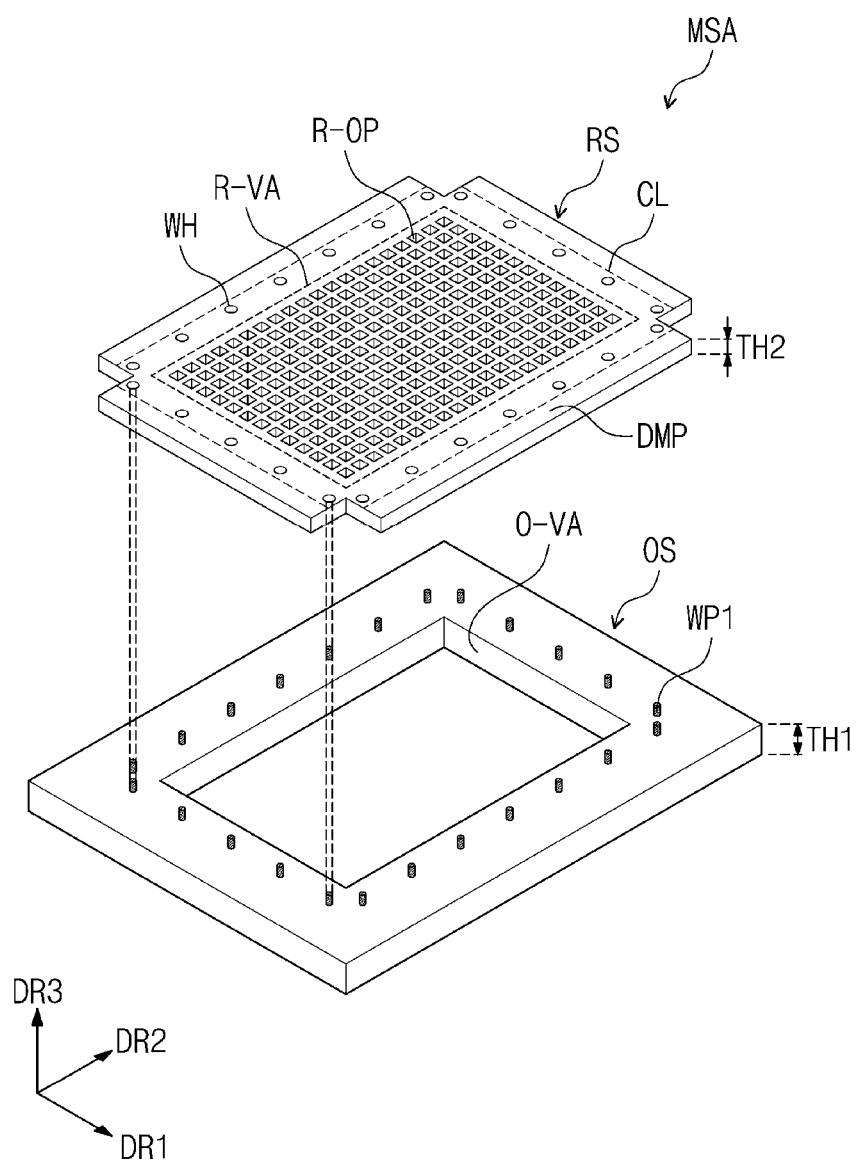
FIG. 3 is an exploded perspective view showing a mask assembly according to an embodiment of the disclosure.
Figure 4:
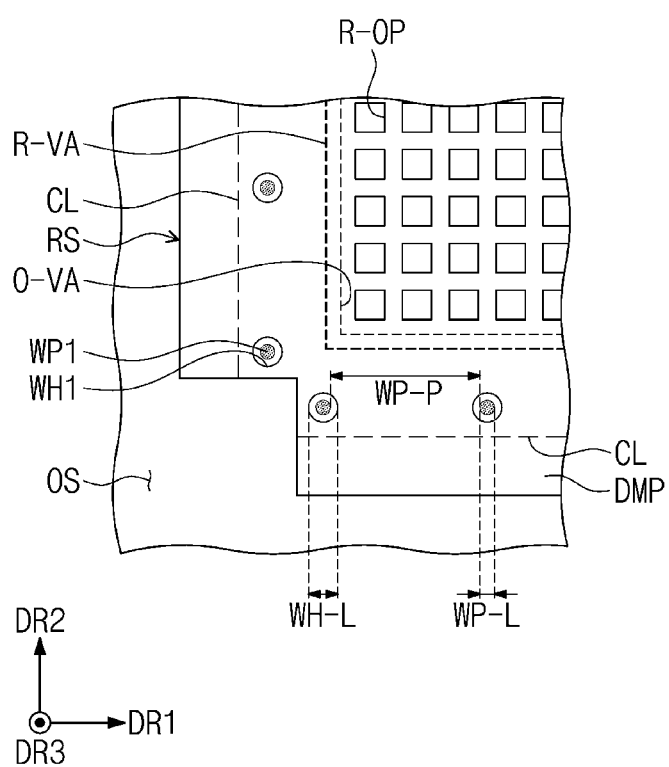
FIG. 4 is an enlarged view showing an area of a mask assembly according to an embodiment of the disclosure.

FIG. 1 is a plan view showing a deposition apparatus EA according to an embodiment of the disclosure. FIG. 2 is a plan view showing a mask assembly MSA according to an embodiment of the disclosure. FIG. 3 is an exploded perspective view showing a mask assembly MSA according to an embodiment of the disclosure. FIG. 4 is an enlarged view showing an area of a mask assembly MSA according to an embodiment of the disclosure.

Referring to FIGS. 1 and 2, the deposition apparatus EA may include a chamber CH, a deposition source ES, a placing unit HM, a mask assembly MSA, a deposition substrate BS, a pressure unit PM, a transfer unit DM, or a combination thereof. The deposition apparatus EA may deposit an organic material or a conductive material on the deposition substrate B S.

The chamber CH may provide an inner space in which a deposition process is performed. The deposition source ES, the placing unit HM, the mask assembly MSA, the deposition substrate BS, the pressure unit PM, and a transfer rod ML of the transfer unit DM may be disposed in the inner space of the chamber CH.

The deposition source ES may provide a deposition material onto a deposition substrate BS. As an example, the deposition source ES may evaporate a deposition material including at least one of an inorganic material and an organic material to the mask assembly MSA. The deposition material may pass through the mask assembly MSA and may be deposited on the deposition substrate BS. The deposition source ES may be implemented by a method of heating and evaporating the deposition material at a high temperature.

Although not shown in figures, the deposition apparatus EA may further include a transfer member to move the deposition source ES in a horizontal direction, e.g., a first direction DR1 and a second direction DR2.

The placing unit HM may be disposed on a sidewall of the chamber CH and may support the mask assembly MSA. The shape, position, and number of the placing units HM should not be particularly limited as long as the placing unit HM may support the mask assembly MSA.

The mask assembly MSA may be supported by the placing unit HM. The mask assembly MSA may include an open sheet OS and multiple masks RS. The open sheet OS and the mask RS may include Invar.

Referring to FIG. 2, the open sheet OS may be provided with a deposition hole O-VA defined therethrough. The deposition hole O-VA may be defined through the open sheet OS in a third direction DR3 that is a thickness direction of the open sheet OS. The deposition hole O-VA may be defined to correspond to an area in which the deposition material is deposited on the deposition substrate BS. An area of the deposition substrate BS where the deposition process is performed through the deposition hole O-VA may form a display panel DP (refer to FIG. 10) as a single unit.

The deposition hole O-VA may be provided in plural and may be defined on the open sheet OS. The deposition holes O-VA may be arranged in the first direction DR1 and the second direction DR2 and may be spaced apart from each other. FIG. 2 shows the deposition holes O-VA arranged in two rows by five columns as a representative example. However, the number of the deposition holes O-VA defined on the open sheet OS should not be particularly limited as long as the deposition holes O-VA are arranged in the form of a matrix of n by m (n and m are natural numbers).

The mask RS may be disposed on the open sheet OS. The mask RS may be provided with multiple deposition openings R-OP arranged in an opening area R-VA that entirely overlaps the deposition hole O-VA. The deposition openings R-OP may be defined on the mask RS in a thickness direction of the mask RS, i.e., the third direction DR3.

The mask RS may be provided in plural, and the masks RS may be disposed on corresponding deposition holes O-VA. After the deposition material passes through the deposition openings R-OP, the deposition material may be patterned to have shapes that are separately formed on the deposition substrate BS. The patterned deposition material may form insulating layers or conductive patterns included in the display panel DP (refer to FIG. 10). The mask RS may include Invar.

The open sheet OS may include an alignment protrusion WP1 disposed on an area adjacent to the deposition hole O-VA. The alignment protrusion WP1 may be formed on the open sheet OS through a welding process. The alignment protrusion WP1 may be provided in plural, and the alignment protrusions WP1 may surround the deposition hole O-VA. The open sheet OS may include Invar According to an embodiment, the alignment protrusion WP1 may have a circular shape. In the disclosure, the shape of the alignment protrusion WP1 in a plan view may include a non-uniform shape caused by welding strength and conditions in a welding process.

According to an embodiment, the open sheet OS may include a fixing protrusion WP2 where the mask RS is provided on the open sheet OS. The fixing protrusion WP2 may be formed on the mask RS through a welding process. The fixing protrusion WP2 may be provided in plural, and the fixing protrusions WP2 may surround the opening area R-VA. The fixing protrusion WP2 may be spaced apart from the alignment protrusion WP1 by a first separation distance.

The mask RS may be provided with a protrusion hole WH defined on an area adjacent to the deposition openings R-OP. The protrusion hole WH may overlap the alignment protrusion WP1. The protrusion hole WH may be defined on the mask RS in the third direction DR3, i.e., a thickness direction of the mask RS. The protrusion hole WH and the deposition openings R-OP may be formed by a photolithography process.

The protrusion hole WH may be provided in plural, and each protrusion hole WH may overlap each alignment protrusions WP. The protrusion hole WH may have a diameter greater than a diameter of the alignment protrusion WP1. The protrusion hole WH may have a shape corresponding to a shape of the alignment protrusion WP1. As an example, when the alignment protrusion WP1 has a circular shape, the protrusion hole WH may have a circular shape, and when the alignment protrusion WP1 has an oval shape, the protrusion hole WH may have an oval shape, however, this is merely one example. According to an embodiment, the shape of the alignment protrusion WP1 may be different from the shape of the protrusion hole WH when viewed in a plan.

The alignment protrusion WP1 disposed in the open sheet OS and the protrusion hole WH defined on the mask RS may be used for the process of aligning the deposition hole O-VA with the deposition openings R-OP included in the opening area R-VA.

The fixing protrusion WP2 may be formed when the open sheet OS is combined with the mask RS after the deposition hole O-VA is aligned with the deposition openings R-OP.

For example, the fixing protrusion WP2 may be formed on the mask RS by a welding process after the deposition hole O-VA is aligned with the deposition openings R-OP.

The fixing protrusion WP2 described in the disclosure may be an element formed on the mask RS, however, the fixing protrusion WP2 may be an impurity that remains on the open sheet OS after the mask RS is removed. The mask RS, a welding rod, and the open sheet OS are melted and joined together in the welding process, and thus, the fixing protrusion WP2 is formed in the process of coupling the mask RS and the open sheet OS. Hereinafter, the fixing protrusion WP2 will be described as an element included in the open sheet OS.

The support plate YK may accommodate the magnetic plate MP. The support plate YK may be coupled with the transfer unit DM to allow the magnetic plate MP to closely contact the deposition substrate BS or separate the magnetic plate MP from the deposition substrate BS.

The cooling plate (not shown) may be disposed between the deposition substrate BS and the support plate YK. The cooling plate may cool the deposition substrate BS or the mask MS to prevent the deposition substrate BS or the mask assembly MSA from being overheated in the deposition process. Thus, the deposition substrate BS may be prevented from being deformed. A cooling line to which a coolant or a cooled air is injected may be provided inside the cooling plate.

The transfer unit DM may be connected to the pressure unit PM. The transfer unit DM may include a transfer rod ML and a transferring main body MC. The transferring main body MC may transfer the pressure unit PM by means of the transfer rod ML in the third direction DR3, i.e., a vertical direction.

For example, the transferring main body MC may be disposed outside the chamber CH. The transferring main body MC may be realized by wither a cylinder or a motor. For example, in case the transferring main body MC is a cylinder, the transfer rod ML may be a piston. In case the transferring main body MC is a motor, the transfer rod ML may be a ball screw shaft that is movable in the vertical direction by rotation of the motor. However, the embodiment of the disclosure is not limited thereto. For example, the transfer unit DM may include all forms of devices as long as the transfer unit DM is able to transfers the pressure unit PM.

FIGS. 3 and 4 show the open sheet OS separated from the mask RS before the fixing protrusion WP2 is formed by a welding process.

The open sheet OS may include the alignment protrusion WP1 protruded from a surface thereof, which is to be in contact with the mask RS. The alignment protrusion WP1 may be provided in plural, and the alignment protrusions WP1 may surround the deposition hole O-VA.

Before being coupled with the open sheet OS, the mask RS may be provided with the protrusion hole WH defined therethrough to overlap the alignment protrusion WP1. The protrusion hole WH may be provided in plural, and the protrusion holes WH may be formed to correspond to the alignment protrusions WP1 disposed on the open sheet OS.

The mask RS in the state before being coupled with the open sheet OS may include a cutting line CL defined therein. An area spaced apart from the protrusion holes WH with the cutting line CL interposed therebetween may be defined as a dummy portion DMP. Since the dummy portion DMP is a portion formed to move the mask RS easily, such as placing the mask RS on the open sheet OS, the dummy portion DMP may be removed after the mask RS is combined with the open sheet OS, however, it should not be limited thereto or thereby. The cutting line CL and the dummy portion DMP may be omitted from the mask RS.

The open sheet OS may have a first thickness TH1 ranging from about 50 um to about 150 um. In case where the thickness of the open sheet OS is smaller than about 50 um, the open sheet OS may not support masks RS disposed thereon, and in case the thickness of the open sheet OS is greater than about 150 um, a shadow effect, i.e., poor deposition caused by the thickness of the open sheet OS, may occur.

The mask RS may have a second thickness TH2 ranging from about 10 um to about 30 um, however, it should not be limited thereto or thereby. The thickness of the mask RS may be determined in various ways depending on a resolution of the display panel DP formed by a deposition process and should not be particularly limited.

According to the disclosure, the alignment protrusion WP1 may have a diameter ranging from about 200 μm to about 500 um. A diameter of the protrusion hole WH may be greater by about 10 um to about 50 um than the diameter of the alignment protrusion WP1.

A thickness of the alignment protrusion WP1 in the third direction DR3 may be same as or greater than a depth of the protrusion hole WH in the third direction DR3. Accordingly, the mask RS may be easily combined with the alignment protrusion WP1 of the open sheet OS.

As shown in FIG. 4, a separation distance WP-P between the alignment protrusions WP1 may be equal to or greater than about 2 mm or equal to or smaller than about 5 mm.

At least one fixing protrusion WP2 (refer to FIG. 2) formed in the welding process to combine the mask RS with the open sheet OS may be disposed in a space defined between the alignment protrusions WP1 and indicated by the separation distance WP-P.

Figure 5:
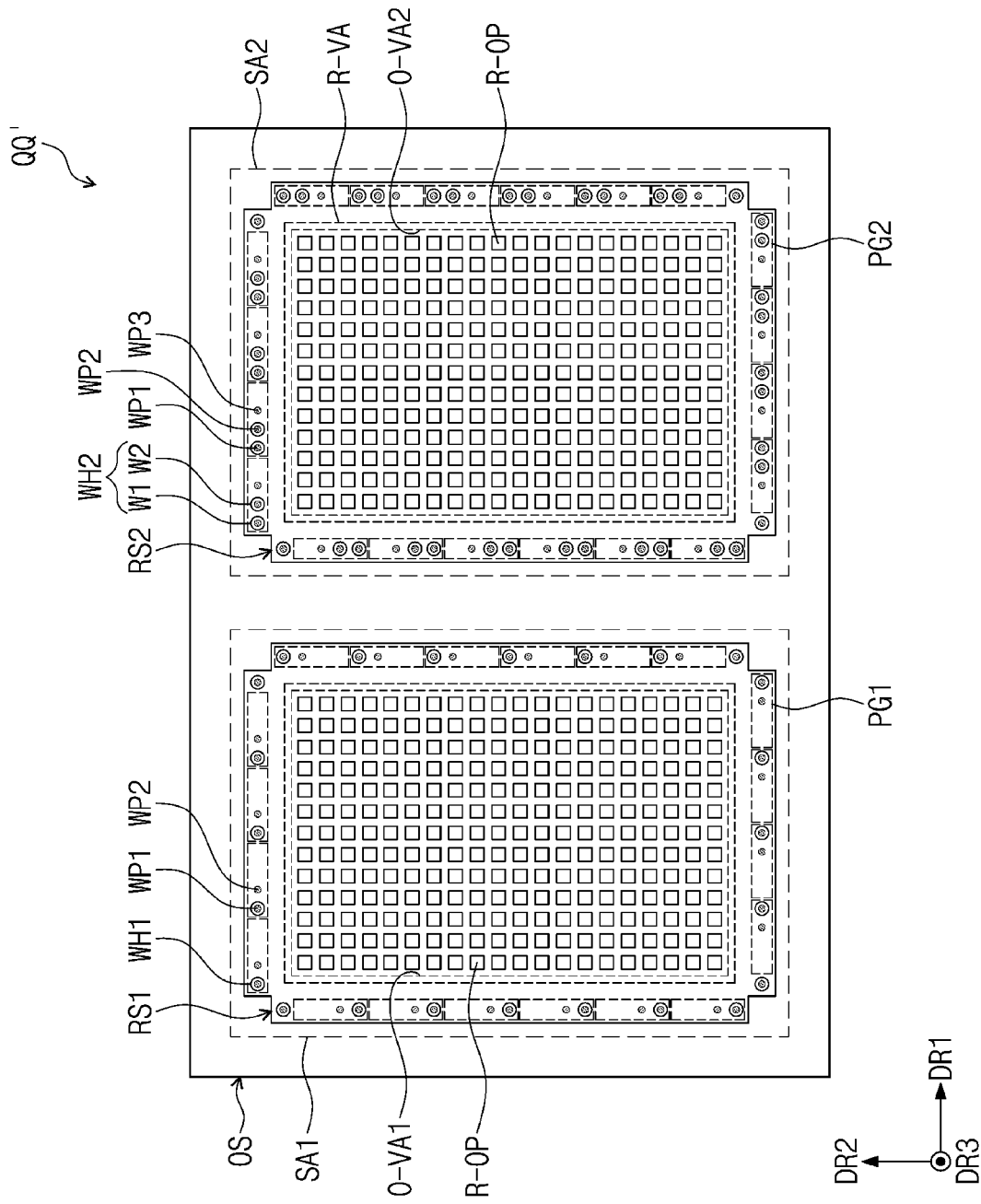
FIG. 5 is an enlarged plan view showing an area QQ' of FIG. 2.
Figure 6A:
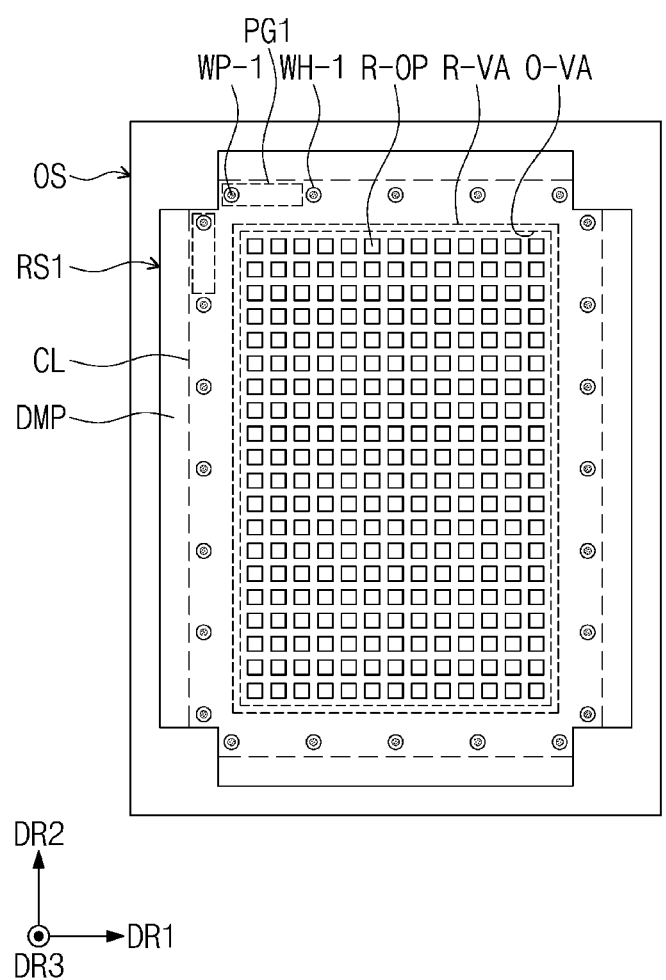
FIGS. 6A to 6C are plan views showing a process of assembling a mask assembly according to an embodiment of the disclosure.
Figure 6B:
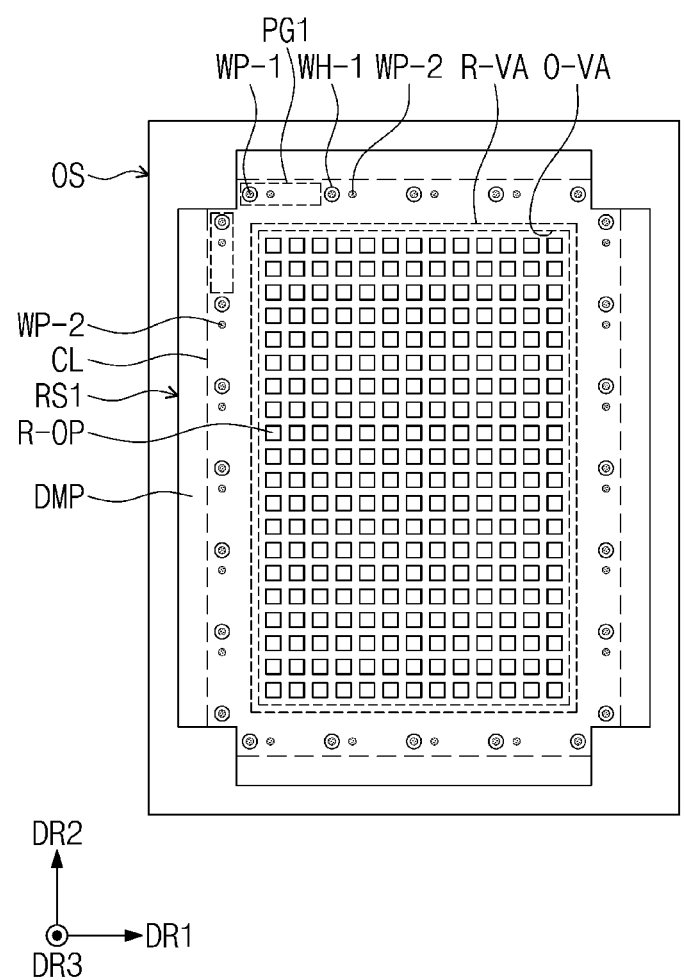
Figure 6C:
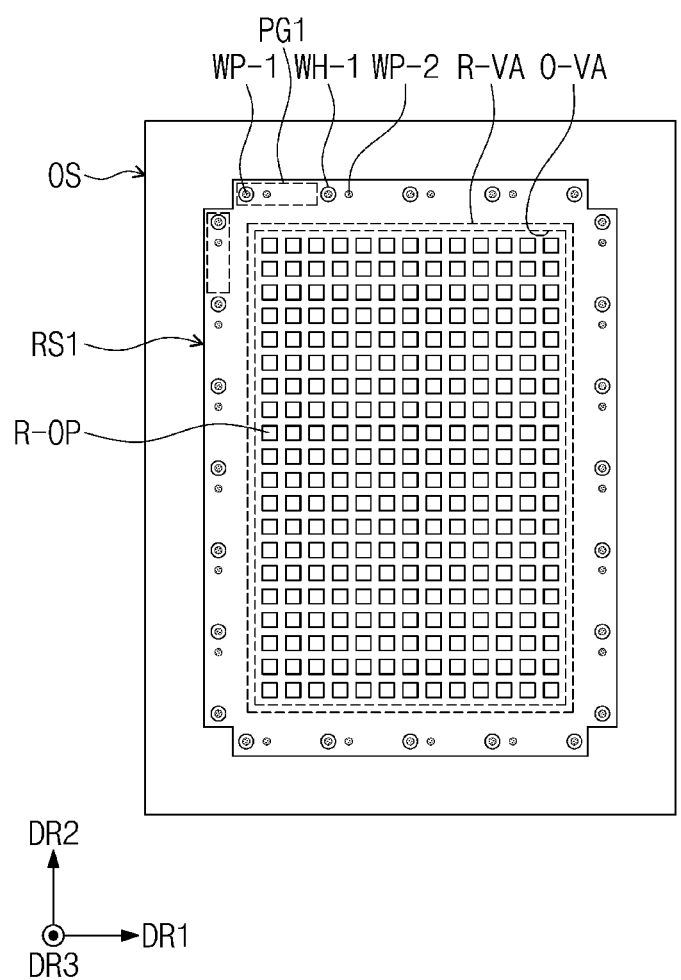
Figure 7A:
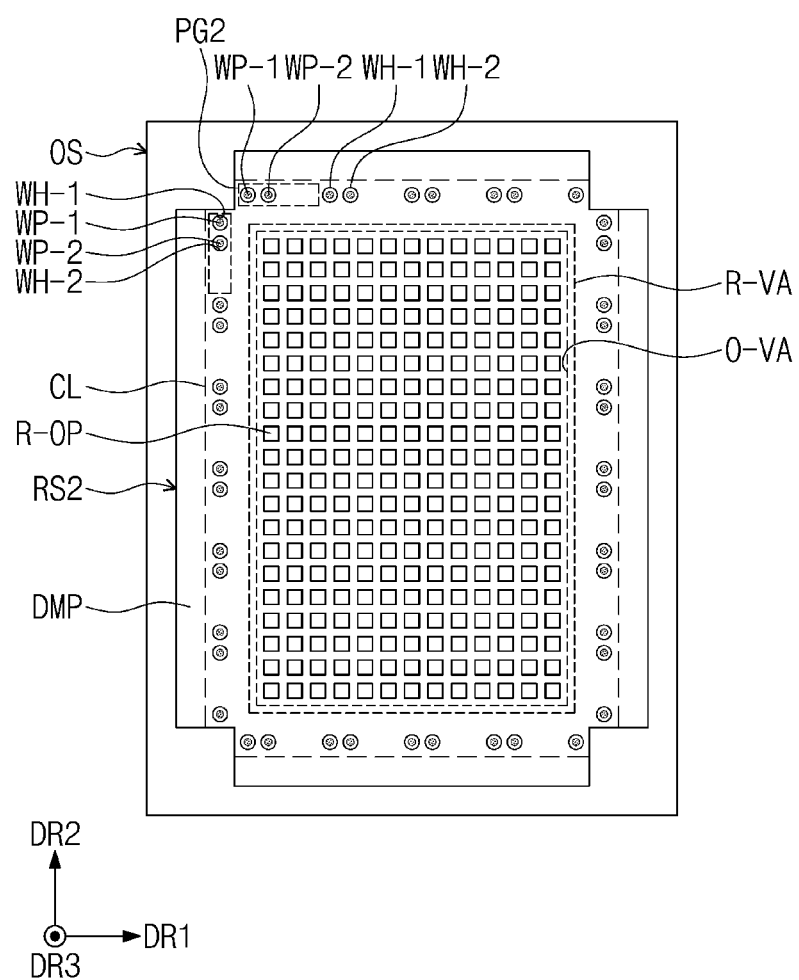
FIGS. 7A to 7C are plan views showing a process of repairing a mask assembly according to an embodiment of the disclosure.
Figure 7B:
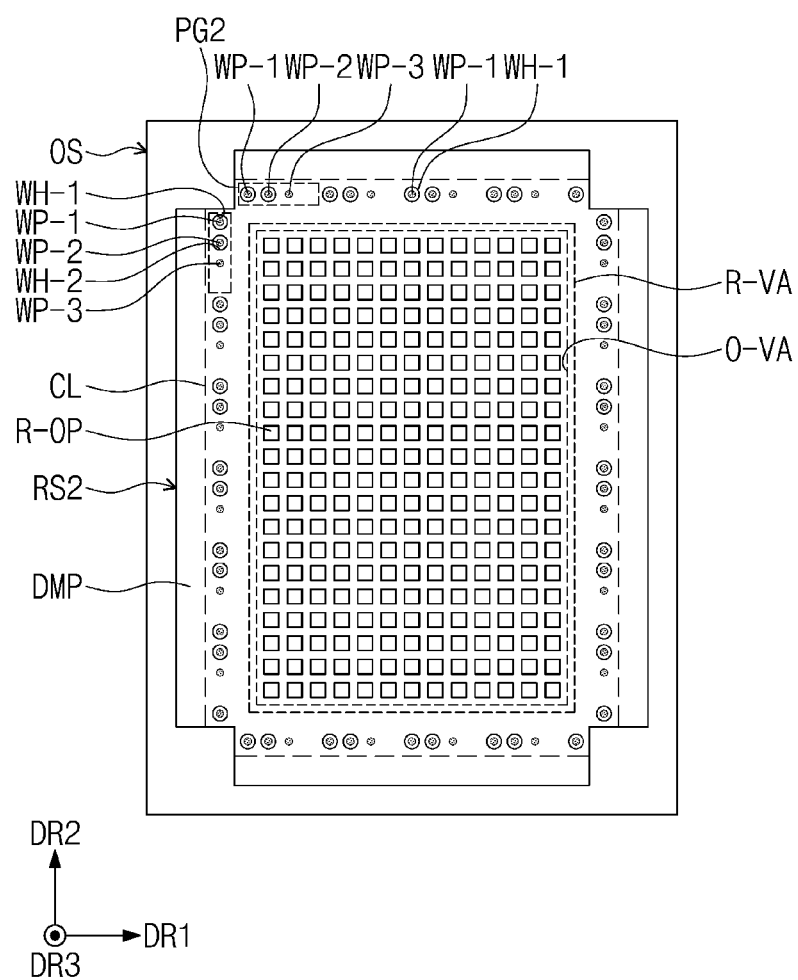
Figure 7C:
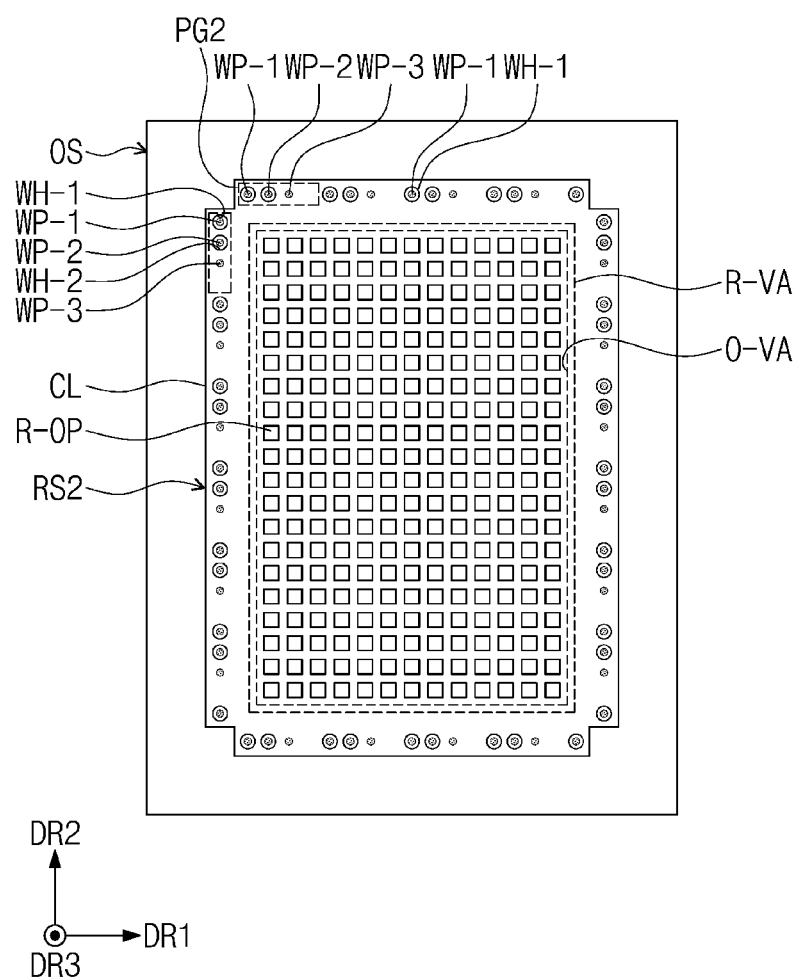
Figure 8A:
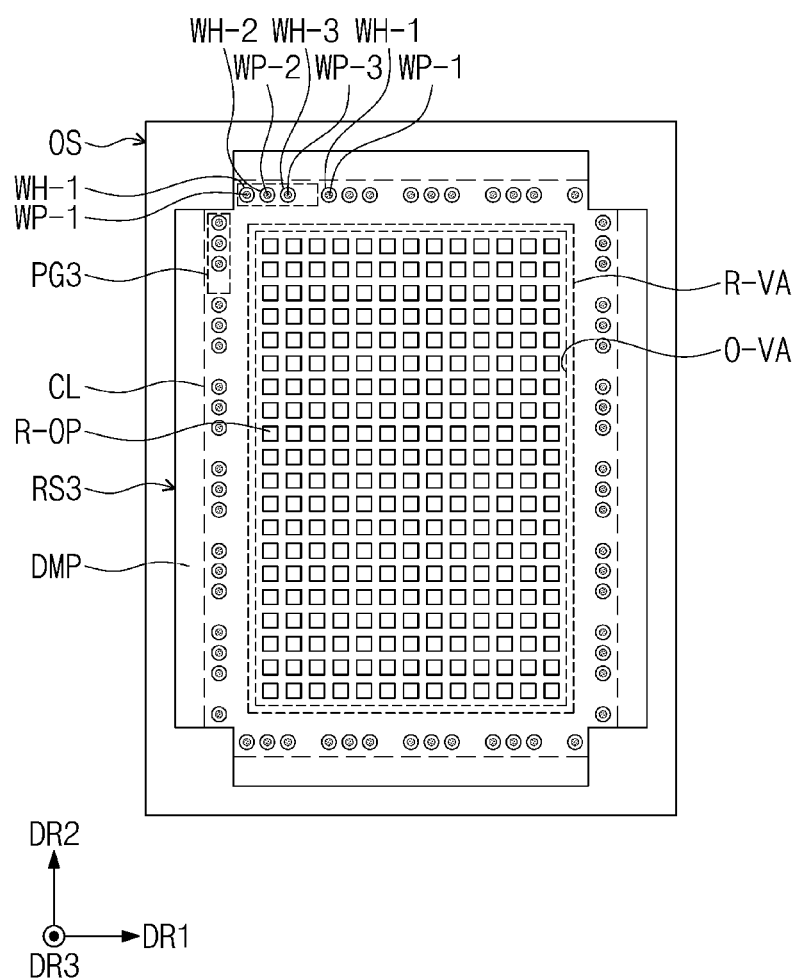
FIGS. 8A to 8C are plan views showing a process of repairing a mask assembly according to an embodiment of the disclosure.
Figure 8B:
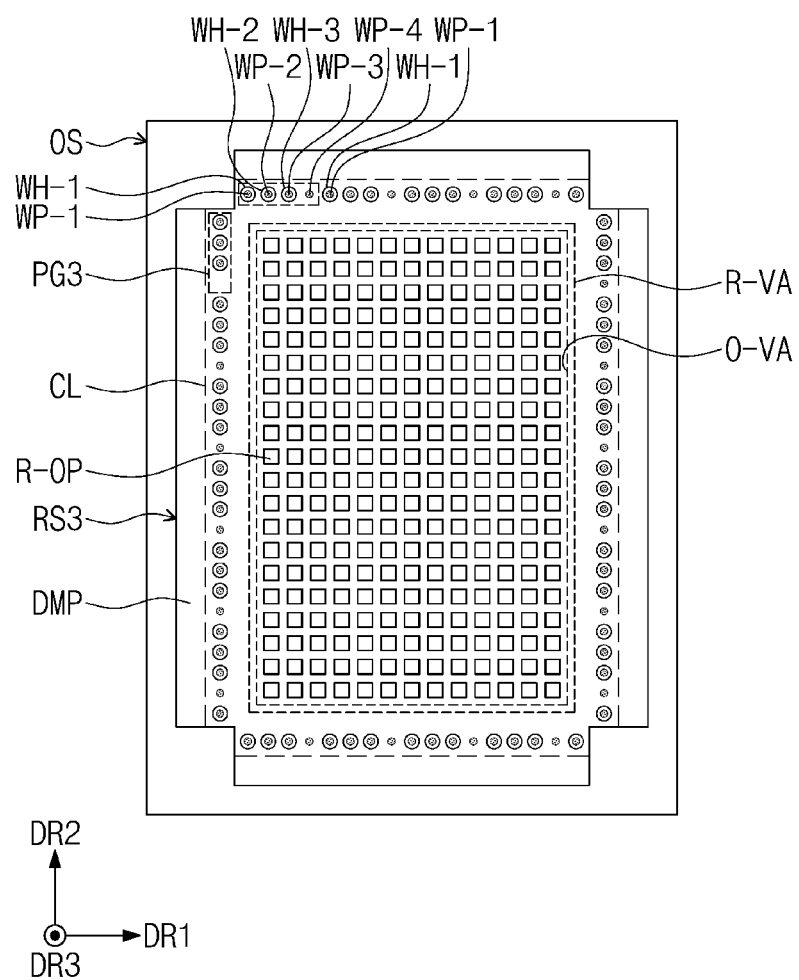
Figure 8C:
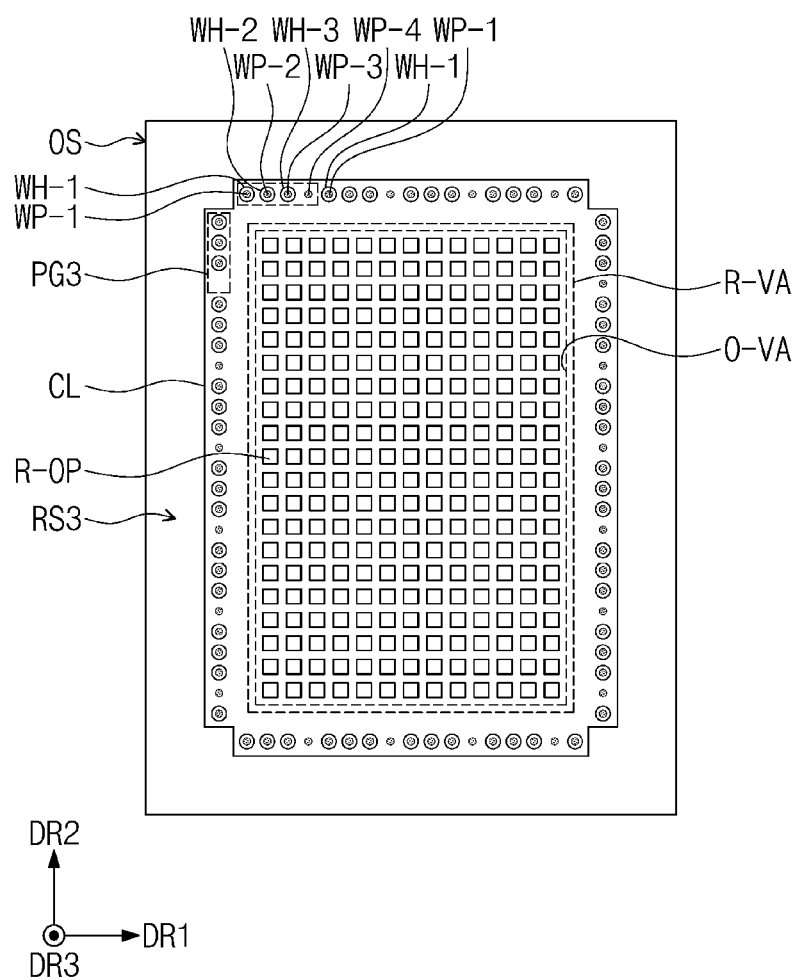

FIG. 5 is an enlarged plan view showing an area QQ' of FIG. 2. FIGS. 6A to 6C are plan views showing a process of assembling the mask assembly MSA according to an embodiment of the disclosure. FIGS. 7A to 7C are plan views showing a process of repairing the mask assembly MSA according to an embodiment of the disclosure. FIGS. 8A to 8C are plan views showing a process of repairing the mask assembly MSA according to an embodiment of the disclosure.

Hereinafter, the repairing method of the mask assembly MSA will be described with reference to FIGS. 5 to 8C.

Referring to FIG. 5, the open sheet OS may include a first area SA1 and a second area SA2, which are defined therein. The first area SA1 may correspond to an area of the open sheet OS through which the first deposition hole O-VA1 is defined, and the second area SA2 may correspond to another area of the open sheet OS through which the second deposition hole O-VA2 is defined.

The first area SA1 may correspond to an area in which a first mask RS1 is first combined with the open sheet OS, and the second area SA2 may correspond to an area in which a second mask RS2 is second combined with the open sheet OS after the first mask RS1 is combined with and removed from the open sheet OS.

The first combined first mask RS1 may be a mask that is first combined with the open sheet OS. The first combined first mask RS1 may be provided with multiple deposition openings R-OP and a first protrusion hole WH1, which overlap the first area SA1.

A first protrusion group PG1 may be defined in the first area SA1 of the open sheet OS. The first protrusion group PG1 may include a first protrusion WP1 and a second protrusion WP2. The first protrusion group PG1 may be provided in plural, and the multiple first protrusion groups PG1 (multiple PG1s) may be disposed to surround the first deposition hole O-VA1.

The first protrusion WP1 of the first protrusion group PG1 may correspond to the above-mentioned alignment protrusion. Accordingly, the first protrusion WP1 may be provided on the open sheet OS before the first mask RS1 is disposed on the open sheet OS.

The second protrusion WP2 of the first protrusion group PG1 may correspond to the above-mentioned fixing protrusion. Accordingly, the second protrusion WP2 may be formed during the process of combining the first mask RS1 with the open sheet OS in the first area SA1.

The second combined second mask RS2 may be a mask that is second combined with the open sheet OS overlapping the second area SA2 after the first mask RS1 is first combined with and removed from the open sheet OS overlapping the second area SA2. The second mask RS2 may be a mask that is used to replace the first mask RS1 in case the first mask RS1 removed from the second area SA2 is defective or that is used to deposit a pattern different from that of the first mask RS1.

The second mask RS2 may include multiple deposition openings R-OP and a second protrusion hole WH2, which overlap the second area SA2.

A second protrusion group PG2 may be defined in the second area SA2 of the open sheet OS. The second protrusion group PG2 may include a first protrusion WP1, a second protrusion WP2, a third protrusion WP3, or a combination thereof. The second protrusion group PG2 may be provided in plural, and the multiple second protrusion groups PG2 (multiple PG2s) may be disposed to surround the second deposition hole O-VA2.

The first protrusion WP1 and the second protrusion WP2 of the second protrusion group PG2 may correspond to the above-mentioned alignment protrusion. The first protrusion WP1 may be provided on the open sheet OS before the first mask RS1 is disposed on the open sheet OS.

The second protrusion WP2 may be a by-product of the welding process, which remains on the open sheet OS after removing the first combined first mask RS1 from the second area SA2 of the open sheet OS. So, the second protrusion WP2 used as the fixing protrusion in a previous process may serve as the alignment protrusion in the process of combining with the second mask RS2.

According to the disclosure, the second protrusion hole WH2 defined on the second mask RS2 may include a first hole W1 and a second hole W2 to allow the second protrusion WP2 of the second protrusion group PG2 to serve as an alignment protrusion. The first hole W1 may overlap the first protrusion WP1, and the second hole W2 may overlap the second protrusion WP2.

Accordingly, the alignment between the deposition openings R-OP of the second mask RS2 and the second deposition hole O-VA2 in the second area SA2 may be achieved by aligning the first hole W1 with the first protrusion WP1 and aligning the second hole W2 with the second protrusion WP2.

The third protrusion WP3 of the second protrusion group PG2 may correspond to the above-mentioned fixing protrusion. Accordingly, the third protrusion WP3 may be formed in the second area SA2 during the process of combining the second mask RS2 with the open sheet OS.

According to an embodiment of the mask assembly MSA (refer to FIG. 2), the masks RS1 and RS2 which has different numbers of protrusion holes may be disposed on one open sheet OS.

According to the embodiment, a distance between the first protrusion WP1 (alignment protrusion) and the second protrusion WP2 (fixing protrusion), which are included in the first protrusion group PG1, may be same as a distance between the first protrusion PW1 (alignment protrusion) and the second protrusion WP2 (alignment protrusion), which are included in the second protrusion group PG2.

A distance between the second protrusion WP2 (fixing protrusion) included in a first-first protrusion group PG1 among the multiple first protrusion groups PG1 and the first protrusion WP1 (alignment protrusion) included in a first-second protrusion group PG1 among the multiple first protrusion groups PG1 may be greater than a distance between the third protrusion WP3 (fixing protrusion) included in a second-first protrusion group PG2 among the multiple second protrusion groups PG2 and the first protrusion WP1 (alignment protrusion) included in a second-second protrusion group PG2 among the multiple second protrusion groups PG2.

According to the disclosure, in the mask replacing process, by omitting the process of removing the fixing protrusion formed by the previous welding process, and by adding a hole on the mask and allowing the existing fixing protrusion to be used as an alignment protrusion, a cost and a time of removing the fixing protrusion may be reduced.

In addition, damages to the open sheet OS when the fixing protrusion is removed may be reduced, and the previously formed fixing protrusion may be used as the alignment protrusion in the repairing process. Accordingly, the mask assembly MSA (refer to FIG. 2) of the deposition apparatus EA (refer to FIG. 1) may have improved deposition performance.

FIGS. 6A to 6C are plan views showing the process of assembling the mask assembly MSA according to an embodiment of the disclosure. FIGS. 7A to 7C are plan views showing the process of repairing the mask assembly according to an embodiment of the disclosure. FIGS. 8A to 8C are plan views showing the process of repairing the mask assembly MSA according to an embodiment of the disclosure. In FIGS. 6A to 6C, 7A to 7C, and 8A to 8C, the same/similar reference numerals denote the same/similar elements in FIGS. 1 to 5, and thus, detailed descriptions of the same/similar elements will be omitted.

FIG. 5 shows an embodiment that compares the masks RS1 and RS2 disposed in different areas on the open sheet OS, and FIGS. 6A to 8C show embodiments of the repairing method of the mask assembly MSA to replace the masks in one area of the open sheet OS.

Referring to FIGS. 6A to 6C, the repairing method of the mask assembly may include providing the open sheet OS, providing the first mask RS1, aligning the deposition hole O-VA with the deposition openings R-OP, combining the open sheet OS with the first mask RS1, removing the dummy portion DMP from the first mask RS1, or a combination thereof.

As shown in FIG. 6A, a first protrusion WP-1 may be formed in the first protrusion group PG1 of an initial open sheet OS before the first mask RS1 is combined. The first protrusion WP-1 may be formed on the initial open sheet OS through a welding process. The first protrusion WP-1 may be provided in plural, and the first protrusions WP-1 may be formed to be spaced apart from the deposition hole O-VA and to surround the deposition hole O-VA.

Multiple deposition openings R-OP overlapping the deposition hole O-VA and a first protrusion hole WH-1 overlapping the first protrusion WP-1 of the open sheet OS may be defined on the first mask RS1. The first protrusion hole WH-1 may be provided in plural, and the first protrusion holes WH-1 may be formed to correspond to the first protrusions WP-1. The deposition openings R-OP and the first protrusion hole WH-1 may be formed on the first mask RS1 by a photolithography process.

The aligning of the deposition hole O-VA of the initial open sheet OS with the deposition openings R-OP of the first mask RS1 may be performed by aligning the first protrusion WP-1 with the first protrusion hole WH-1.

Next, as shown in FIG. 6B, the combining of the open sheet OS with the first mask RS1 may be performed by forming a second protrusion WP-2 on the first mask RS1. The second protrusion WP-2 may be spaced apart from the first protrusion WP-1. The second protrusion WP-2 may be formed on the first mask RS1 through a welding process.

After the first mask RS1 is combined with the open sheet OS, the first protrusion WP-1 and the second protrusion WP-2 may be formed in the first protrusion group PG1.

The first protrusion WP-1 of the open sheet OS may serve as the above-mentioned alignment protrusion, and the second protrusion WP-2 may serve as the above-mentioned fixing protrusion.

As shown in FIG. 6C, the repairing method may further include cutting the dummy portion DMP of the first mask RS1 along the cutting line CL. However, the removing of the dummy portion DMP may be omitted.

In a case where the first mask RS1 is defective, the repairing method may further include removing the first mask RS1 from the open sheet OS.

When the first mask RS1 is removed from the open sheet OS, the second protrusion WP-2, which is previously used as a fixing protrusion, may remain on the open sheet OS.

Then, the second protrusion WP-2 may be used as an alignment protrusion in a process of combining a new mask with the open sheet OS.

Referring to FIGS. 7A to 7C, the repairing method of the mask assembly may include providing the second mask RS2 on the open sheet OS, aligning the deposition hole O-VA with the deposition openings R-OP, combining the open sheet OS with the second mask RS2, removing the dummy portion DMP of the second mask RS2, or a combination thereof.

The deposition openings R-OP overlapping the deposition hole O-VA and the second protrusion hole WH-2 may be defined on the second mask RS2.

In the embodiment, the second protrusion hole may include the first hole WH-1 overlapping the first protrusion WP-1 provided on the initial open sheet OS and the second hole WH-2 overlapping the second protrusion WP-2 remaining on the open sheet OS when the first mask RS1 is removed.

The deposition openings R-OP, the first hole WH-1, and the second hole WH-2 of the second mask RS2 may be formed on the second mask RS2 by a photolithography process.

The aligning of the deposition hole O-VA of the open sheet OS with the deposition openings R-OP of the second mask RS2 may be performed by aligning the first protrusion WP-1 with the first hole WH-1 and aligning the second protrusion WP-2 with the second hole WH-2.

As shown in FIG. 7B, the combining of the open sheet OS with the second mask RS2 may be performed by forming a third protrusion WP-3 on the second mask RS2. The third protrusion WP-3 may be spaced apart from the first protrusion WP-1 and the second protrusion WP-2. The third protrusion WP-3 may be formed on the second mask RS2 through a welding process.

After the second mask RS2 is combined with the open sheet OS, the first protrusion WP-1, the second protrusion WP-2, and the third protrusion WP-3 may be formed in the second protrusion group PG2.

The first protrusion WP-1 and the second protrusion WP-2 of the second mask RS2 may serve as the above-mentioned alignment protrusion, and the third protrusion WP-3 of the second mask RS2 may serve as the above-mentioned fixing protrusion.

Referring to FIG. 7C, the repairing method may further include cutting the dummy portion DMP of the second mask RS2 along the cutting line CL. However, the removing of the dummy portion DMP may be omitted.

In a case where the second mask RS2 is defective, the repairing method may further include removing the second mask RS2 from the open sheet OS.

When the second mask RS2 is removed from the open sheet OS, the third protrusion WP-3 that is previously used as the fixing protrusion may remain on the open sheet OS.

The third protrusion WP-3 may be used as an alignment protrusion in the combining of a new mask with the open sheet OS.

In case the second mask RS2 is defective, the repairing method may further include removing the second mask RS2 from the open sheet OS.

Referring to FIGS. 8A to 8C, the repairing method of the mask assembly may include providing a third mask RS3 on the open sheet OS, aligning the deposition hole O-VA with the deposition openings R-OP, combining the open sheet OS with the third mask RS3, removing the dummy portion DMP of the third mask RS3, or a combination thereof.

The deposition openings R-OP overlapping the deposition hole O-VA and a third protrusion hole may be defined on the third mask RS3.

In the embodiment, the third protrusion hole may include the first hole WH-1 overlapping the first protrusion WP-1 provided on the initial open sheet OS, the second hole WH-2 overlapping the second protrusion WP-2 remaining on the open sheet OS when the first mask RS1 is removed, a third hole WH-3 overlapping the third protrusion WP-3 remaining on the open sheet OS when the second mask RS2 is removed, or a combination thereof.

The deposition openings R-OP, the first hole WH-1, the second hole WH-2, and the third hole WH-3 of the third mask RS3 may be formed on the third mask RS3 by a photolithography process.

The aligning of the deposition hole O-VA of the open sheet OS with the deposition openings R-OP of the third mask RS3 may be performed by aligning the first protrusion WP-1 with the first hole WH-1, aligning the second protrusion WP-2 with the second hole WH-2, and aligning the third protrusion WP-3 with the third hole WH-3.

Referring to FIG. 8B, the combining the open sheet OS with the third mask RS3 may be performed by forming a fourth protrusion WP-4 on the third mask RS3. The fourth protrusion WP-4 may be spaced apart from the first protrusion WP-1, the second protrusion WP-2, and the third protrusion WP-3. The fourth protrusion WP-4 may be formed on the third mask RS3 through a welding process.

After the third mask RS3 is combined with the open sheet OS, the first protrusion WP-1, the second protrusion WP-2, the third protrusion WP-3, and the fourth protrusion WP-4 may be formed in a third protrusion group PG3.

The first protrusion WP-1, the second protrusion WP-2, and the third protrusion WP-3 of the third mask RS3 may serve as the above-mentioned alignment protrusion, and the fourth protrusion WP-4 of the third mask RS3 may serve as the above-mentioned fixing protrusion.

Referring to FIG. 8C, the repairing method may further include cutting the dummy portion DMP of the third mask RS3 along the cutting line CL. However, the removing of the dummy portion DMP may be omitted.

In a case where the third mask RS3 is defective, the repairing method may further include removing the third mask RS3 from the open sheet OS.

When the third mask RS3 is removed from the open sheet OS, the fourth protrusion WP-4 that is previously used as the fixing protrusion may remain on the open sheet OS.

The fourth protrusion WP-4 may be used as an alignment protrusion in the process of combining a new mask on the open sheet OS.

FIGS. 6A to 8C show the embodiment in which three repairing processes are performed three times, however, the number of the repairing processes should not be limited thereto or thereby. According to an embodiment, the mask assembly MSA in which the repairing processes may be performed four or more times by adjusting a distance between initial alignment protrusions of adjacent ones of the multiple protrusion groups.

The welding process may be performed using either a picosecond laser beam or a femtosecond laser beam.

Figure 9:
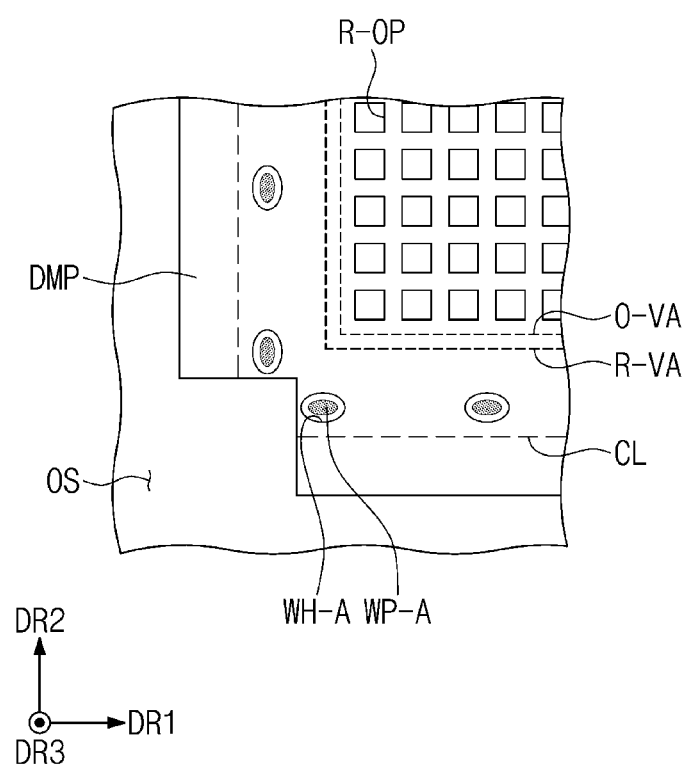
FIG. 9 is an enlarged plan view showing a portion of a mask assembly according to an embodiment of the disclosure.

FIG. 9 is an enlarged plan view showing a portion of a mask assembly MSA according to an embodiment of the disclosure. In FIG. 9, the same/similar reference numerals denote the same/similar elements in FIGS. 1 to 5, and thus, detailed descriptions of the same/similar elements will be omitted.

Referring to FIG. 9, an alignment protrusion WP-A included in an open sheet OS may have an oval shape. A protrusion hole WH-A included in a mask RS may also have an oval shape with a larger diameter in major and minor axes than the alignment protrusion WP-A. Accordingly, alignment characteristics between the open sheet OS and the mask RS may be improved.

However, it should not be limited thereto or thereby, and the shape of the protrusion hole WH-A may be different from the shape of the alignment protrusion WP-A as long as the protrusion hole WH-A may be combined with the alignment protrusion WP-A.

Figure 10:
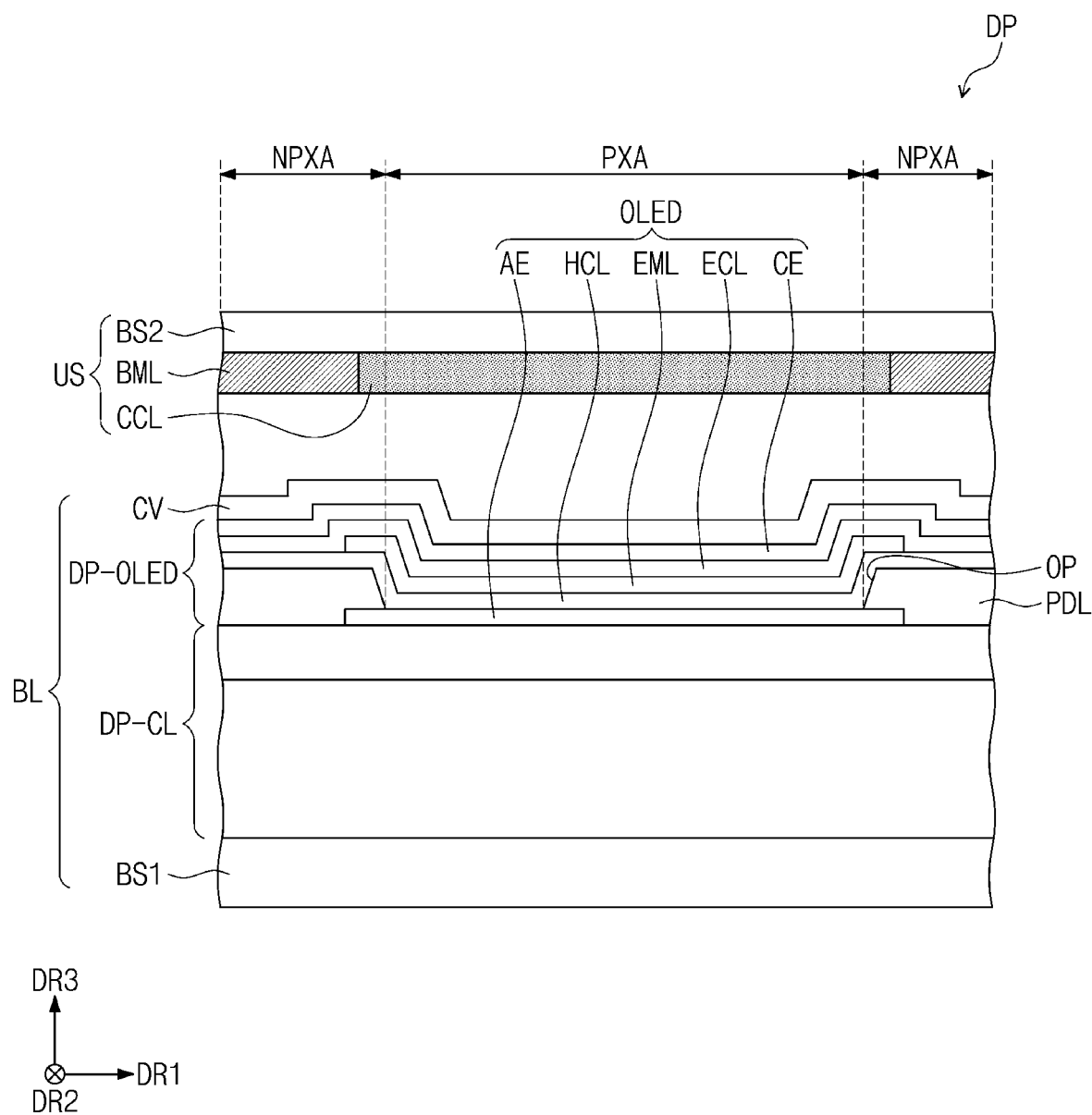
FIG. 10 is a cross-sectional view showing a display panel according to an embodiment of the disclosure.

FIG. 10 is a schematic cross-sectional view showing a display panel DP according to an embodiment of the disclosure. Any one of multiple layers of the display panel DP described with reference to FIG. 10 may correspond to a layer formed on the deposition substrate BS by the deposition apparatus EA (refer to FIG. 1) described with reference to FIGS. 1 to 8C.

The display panel DP manufactured by the deposition apparatus EA may be one of a liquid crystal display panel, an electrophoretic display panel, a microelectromechanical system (MEMS) display panel, an electrowetting display panel, an organic light emitting display panel, and an inorganic light emitting display panel, however, it should not be particularly limited.

FIG. 10 shows the display panel DP including an organic light emitting layer as a representative example.

The organic light emitting display panel DP may include a display substrate BL and an encapsulation substrate US. The display substrate BL may include a first base layer BS1, a circuit element layer DP-CL disposed on the first base layer BS1, a display element layer DP-OLED disposed on the circuit element layer DP-CL, a cover layer CV disposed on the display element layer DP-OLED, or a combination thereof. The encapsulation substrate US may include a second base layer BS2, a black matrix layer BML disposed on the second base layer BS2, a color control layer CCL, or a combination thereof.

The first base layer BS1 may include a synthetic resin film. The first base layer BS1 may also include a glass substrate, a metal substrate, an organic or inorganic composite material substrate, or a combination thereof.

The circuit element layer DP-CL may be disposed on the first base layer BS1. The circuit element layer DP-CL may include multiple insulating layers, a semiconductor pattern, a conductive pattern, a signal line, or a combination thereof. An insulating layer, a semiconductor layer, and a conductive layer may be formed by a coating or depositing process. The insulating layer, the semiconductor layer, and the conductive layer may be selectively patterned by a photolithography process. In this way, the semiconductor pattern, the conductive pattern, and the signal line included in the circuit element layer DP-CL and the display element layer DP-OLED may be formed. At least one of the insulating layers and the conductive patterns included in the circuit element layer DP-CL may be formed by the deposition apparatus EA according to the disclosure. Accordingly, the deposition substrate BS of FIG. 1 may correspond to the first base layer BS1. The display element layer DP-OLED may include a light emitting element OLED and a pixel definition layer PDL. The pixel definition layer PDL may be an organic layer. The light-emitting element OLED may include a first electrode AE, a hole control layer HCL, a light emitting layer EML, an electron control layer ECL, a second electrode CE, or a combination thereof. At least one of the light emitting element OLED and the pixel definition layer PDL may be formed by the deposition apparatus EA according to the disclosure.

FIG. 10 shows a light emitting area PXA and a non-light-emitting area NPXA defined adjacent to the light emitting area PXA. The light emitting area PXA may be defined to correspond to an area of the first electrode AE exposed through a display opening OP.

The hole control layer HCL may be commonly disposed in the light emitting area PXA and the non-light-emitting area NPXA. The hole control layer HCL may include a hole transport layer and may further include a hole injection layer. The light emitting layer EML may be disposed on the hole control layer HCL. The light emitting layer EML may be disposed in an area corresponding to the display opening OP.

The electron control layer ECL may be disposed on the light emitting layer EML. The electron control layer ECL may include an electron transport layer and may further include an electron injection layer. The second electrode CE may be disposed on the electron control layer ECL.

The cover layer CV may be disposed on the second electrode CE. The cover layer CV may include multiple thin layers. According to the embodiment, the cover layer CV may include a capping layer or a thin film encapsulation layer.

The second base layer BS2 may be disposed to be spaced apart from the cover layer CV. The second base layer BS2 may be a glass substrate, a plastic substrate, or a substrate including polyimide (PI).

The color control layer CCL may transmit a first color light or may convert the first color light into a second color light or a third color light depending on a color of a light provided by the light emitting element OLED. The color control layer CCL may include a quantum dot. The first color light may be a blue color light.

The black matrix layer BM may overlap the non-light-emitting area NPXA. The black matrix layer BM may have a black color. The black matrix layer BM may include a material that absorbs the light; however, it should not be particularly limited.

Among the components formed on the base layers BS1 and BS2 of the display panel DP, components formed by the deposition process may be formed using the deposition apparatus EA of the disclosure, however, it should not be particularly limited.

Although the embodiments of the disclosure have been described, it is understood that the disclosure should not be limited to these embodiments but various changes and modifications can be made by one ordinary skilled in the art within the spirit and scope of the disclosure as hereinafter claimed.

Therefore, the disclosed subject matter should not be limited to any single embodiment described herein, and the scope of the disclosure shall be determined according to the attached claims.

What is claimed is:

1. A mask assembly comprising:
   a mask including deposition openings and a protrusion hole; and
   an open sheet including:
      a deposition hole overlapping the deposition openings; and
      an alignment protrusion adjacent to the deposition hole and overlapping the protrusion hole; and
      a fixing protrusion spaced apart from the alignment protrusion, the fixing protrusion being a weld between the open sheet and the mask provided by welding the mask with the open sheet after the alignment protrusion is combined with protrusion hole, the fixing protrusion non-overlapping the protrusion hole.

2. The mask assembly of claim 1, wherein
   the alignment protrusion and the fixing protrusion are defined as a protrusion group,
   the protrusion group is provided in plural, the plurality of protrusion groups surrounding the deposition hole, and
   the protrusion hole is provided in plural, the plurality of protrusion holes corresponding to the alignment protrusions of the plurality of protrusion groups.

3. The mask assembly of claim 2, wherein a separation distance between the alignment protrusions included in adjacent ones of the plurality of protrusion groups is equal to or greater than about 2 mm and equal to or smaller than about 5 mm.

4. The mask assembly of claim 1, wherein the alignment protrusion has a diameter equal to or greater than about 200 micrometers and equal to or smaller than about 500 micrometers.

5. The mask assembly of claim 3, wherein a diameter of the protrusion hole is greater than the diameter of the alignment protrusion by about 10 micrometers or more to about 50 micrometers or less.

6. The mask assembly of claim 1, wherein the open sheet has a first thickness ranging from about 50 um to about 150 um.

* * * * *